US010445002B2

(12) United States Patent
Lin et al.

(10) Patent No.: US 10,445,002 B2
(45) Date of Patent: Oct. 15, 2019

(54) DATA ACCESSING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); An-Cheng Liu, Taipei (TW); Lih Yuarn Ou, Taoyuan (TW); Szu-Wei Chen, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 140 days.

(21) Appl. No.: 15/867,719

(22) Filed: Jan. 11, 2018

(65) Prior Publication Data

US 2019/0163363 A1 May 30, 2019

(30) Foreign Application Priority Data

Nov. 30, 2017 (TW) .............................. 106141792 A

(51) Int. Cl.
| G06F 3/06 | (2006.01) |
| G11C 16/26 | (2006.01) |
| G06F 11/10 | (2006.01) |
| G11C 16/04 | (2006.01) |
| G11C 29/02 | (2006.01) |
| G11C 29/52 | (2006.01) |
| G11C 29/04 | (2006.01) |

(52) U.S. Cl.
CPC ............ *G06F 3/061* (2013.01); *G06F 3/0619* (2013.01); *G06F 3/0658* (2013.01);
(Continued)

(58) Field of Classification Search
CPC .... G06F 3/061; G06F 3/0679; G06F 11/1068; G06F 3/0659; G06F 3/0619;
(Continued)

(56) References Cited

U.S. PATENT DOCUMENTS

2009/0161466 A1 6/2009 Hamilton et al.
2018/0108422 A1* 4/2018 Oh ........................... G11C 7/14
(Continued)

FOREIGN PATENT DOCUMENTS

| TW | 201635296 | 10/2016 |
| TW | 201707002 | 2/2017 |

OTHER PUBLICATIONS

Y. Nakamura, T. Iwasaki and K. Takeuchi, "Machine learning-based proactive data retention error screening in 1Xnm TLC NAND flash," 2016 IEEE International Reliability Physics Symposium (IRPS), Pasadena, CA, 2016, pp. PR-3-1-PR-3-4 (Year: 2016).*

(Continued)

*Primary Examiner* — Cynthia Britt
(74) *Attorney, Agent, or Firm* — JCIPRNET

(57) ABSTRACT

A data accessing method, a memory controlling circuit unit and a memory storage device are provided. The method includes: reading a first physical programming unit by using a first read voltage to obtain first data; reading the first physical programming unit by using a second read voltage to obtain second data; inputting a first state parameter corresponding to the first data and a second state parameter corresponding to the second data into a numerical calculation engine, and determining a third reading voltage for reading the first physical programming unit by the numerical calculation engine.

30 Claims, 12 Drawing Sheets

(52) U.S. Cl.
CPC .......... *G06F 3/0659* (2013.01); *G06F 3/0679* (2013.01); *G06F 11/1068* (2013.01); *G11C 16/0483* (2013.01); *G11C 16/26* (2013.01); *G11C 29/028* (2013.01); *G11C 29/52* (2013.01); *G11C 2029/0407* (2013.01)

(58) Field of Classification Search
CPC . G06F 3/0658; G11C 29/028; G11C 16/0483; G11C 16/26; G11C 2029/0407; G11C 29/52
See application file for complete search history.

(56) References Cited

U.S. PATENT DOCUMENTS

| | | | |
|---|---|---|---|
| 2018/0357535 A1* | 12/2018 | Shulkin | G06N 3/08 |
| 2019/0004734 A1* | 1/2019 | Kirshenbaum | G11C 11/5642 |
| 2019/0006003 A1* | 1/2019 | Kirshenbaum | G11C 16/10 |

OTHER PUBLICATIONS

C. Zambelli et al., "Characterization of TLC 3D-NAND Flash Endurance through Machine Learning for LDPC Code Rate Optimization," 2017 IEEE International Memory Workshop (IMW), Monterey, CA, 2017, pp. 1-4. (Year: 2017).*

Y. Liao, C. Huang, C. Zeng and H. Chang, "Data Analysis and Prediction for Nand Flash Decoding Status," 2017 IEEE International Memory Workshop (IMW), Monterey, CA, 2017, pp. 1-4. (Year: 2017).*

"Office Action of Taiwan Counterpart Application," dated Jul. 25, 2018, pp. 1-6.

* cited by examiner

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

| Lower physical programming unit | Center physical programming unit | Upper physical programming unit | |
|---|---|---|---|
| L_0 | M_0 | U_0 | ~1301 |
| L_1 | M_1 | U_1 | ~1303 |
| L_2 | M_2 | U_2 | ~1305 |
| L_3 | M_3 | U_3 | ~1307 |
| L_4 | M_4 | U_4 | ~1309 |
| L_5 | M_5 | U_5 | ~1311 |
| ⋮ | ⋮ | ⋮ | |
| L_N | M_N | U_N | |

FIG. 13

| Lower physical programming unit | Center physical programming unit | Upper physical programming unit |
|---|---|---|
| VA_1 | VB_1, VC_1 | VD_1, VE_1, VF_1, VG_1 |

~ RR_1

| Lower physical programming unit | Center physical programming unit | Upper physical programming unit |
|---|---|---|
| VA_2 | VB_2, VC_2 | VD_2, VE_2, VF_2, VG_2 |

~ RR_2

| Lower physical programming unit | Center physical programming unit | Upper physical programming unit |
|---|---|---|
| VA_3 | VB_3, VC_3 | VD_3, VE_3, VF_3, VG_3 |

~ RR_3

⋮

| Lower physical programming unit | Center physical programming unit | Upper physical programming unit |
|---|---|---|
| VA_n | VB_n, VC_n | VD_n, VE_n, VF_n, VG_n |

DATA ACCESSING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 106141792, filed on Nov. 30, 2017. The entirety of the above-mentioned patent application is hereby incorporated by reference herein and made a part of this specification.

BACKGROUND

Technology Field

The invention relates to a data accessing method, a memory controlling circuit unit and a memory storage device, and more particularly, to a data accessing method using a numerical calculation engine, a memory controlling circuit unit and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above. In particular, with the rise of numerical operations (such as artificial intelligence, neural networks or deep learning networks) in recent years, finding a way to apply numerical operations to the rewritable non-volatile memory modules so use efficiency of volatile memory modules can be improved is one of the problems to be solved by those skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a data accessing method, a memory control circuit unit and a memory storage device. The data accessing method can improve an accessing efficiency of a rewritable non-volatile memory module by a numerical calculation engine.

The invention provides a data accessing method for a rewritable non-volatile memory module. The rewritable non-volatile memory module has a plurality of physical erasing units, and each physical erasing unit among the physical erasing units includes a plurality of physical programming units. The data accessing method includes: reading a first physical programming unit among the physical programming units to obtain first data by using at least one first read voltage among a plurality of read voltages; reading the first physical programming unit to obtain second data by using at least one second read voltage among the read voltages; inputting a first state parameter corresponding to the first data and a second state parameter corresponding to the second data into a numerical calculation engine; determining a third read voltage for reading the first physical programming unit among the read voltages by the numerical calculation engine according to the first state parameter and the second state parameter; and reading the first physical programming unit to obtain third data by using the third read voltage.

The invention provides a memory controlling circuit unit for a rewritable non-volatile memory module. The rewritable non-volatile memory module has a plurality of physical erasing units. Each physical erasing unit among the physical erasing units has a plurality of physical programming units. The memory controlling circuit unit includes a host interface, a memory interface, a numerical calculation engine and a memory management circuit. The host interface is configured to couple to a host system. The memory interface is configured to couple to a rewritable non-volatile memory module. The memory management circuit is coupled to the host interface, the memory interface and the numerical calculation engine. The memory management circuit is configured to read a first physical programming unit among the physical programming units to obtain first data by using at least one first read voltage among a plurality of read voltages. The memory management circuit is further configured to read the first physical programming unit to obtain second data by using at least one second read voltage among the read voltages. The memory management circuit is further configured to input a first state parameter corresponding to the first data and a second state parameter corresponding to the second data into the numerical calculation engine. The numerical calculation engine is configured to determine a third read voltage for reading the first physical programming unit among the read voltages according to the first state parameter and the second state parameter. The memory management circuit is further configured to read the first physical programming unit to obtain third data by using the third read voltage.

The invention provides a memory storage device. The memory storage device includes a connection interface unit, a rewritable non-volatile memory module and a memory controlling circuit unit. The connection interface unit is configured to couple to a host system. The rewritable non-volatile memory module has a plurality of physical erasing units, and each physical erasing unit among the physical erasing units includes a plurality of physical programming units. The memory controlling circuit unit is coupled to the connection interface unit and the rewritable non-volatile memory module, and has a numerical calculation engine. The memory controlling circuit unit is configured to read a first physical programming unit among the physical programming units to obtain first data by using at least one first read voltage among a plurality of read voltages. The memory controlling circuit unit is further configured to read the first physical programming unit to obtain second data by using at least one second read voltage among the read voltages. The memory controlling circuit unit is further configured to input a first state parameter corresponding to the first data and a second state parameter corresponding to the second data into the numerical calculation engine, and determine a third read voltage for reading the first physical programming unit among the read voltages by the numerical calculation engine according to the first state parameter and the second state parameter. The memory controlling circuit unit is further configured to read the first physical programming unit to obtain third data by using the third read voltage.

Based on the above, if the data is read from the rewritable non-volatile memory module according to the data accessing method of the invention, the optimal read voltage for reading one physical programming unit may be determined by using the numerical calculation engine so the time spent in a retry-read mechanism may be reduced and the accessing efficiency of the rewritable non-volatile memory module may be improved. In addition, if the rewritable non-volatile memory module is being written, other than the capability of determining whether the write data is hot data or cold data by the numerical calculation engine, whether the write data is compressible may also be determined by the numerical calculation engine. Accordingly, if the data is written, the memory management circuit is able to select the best way for writing.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 10 is a schematic diagram illustrating management of physical erasing units according to an exemplary embodiment.

FIG. 13 is a schematic diagram illustrating an example of multiple physical programming unit groups in a physical erasing unit according to an exemplary embodiment.

FIG. 14 is a schematic diagram illustrating a read voltage group for a retry-read mechanism according to an exemplary embodiment of the invention.

DESCRIPTION OF THE EMBODIMENTS

Figure 1:
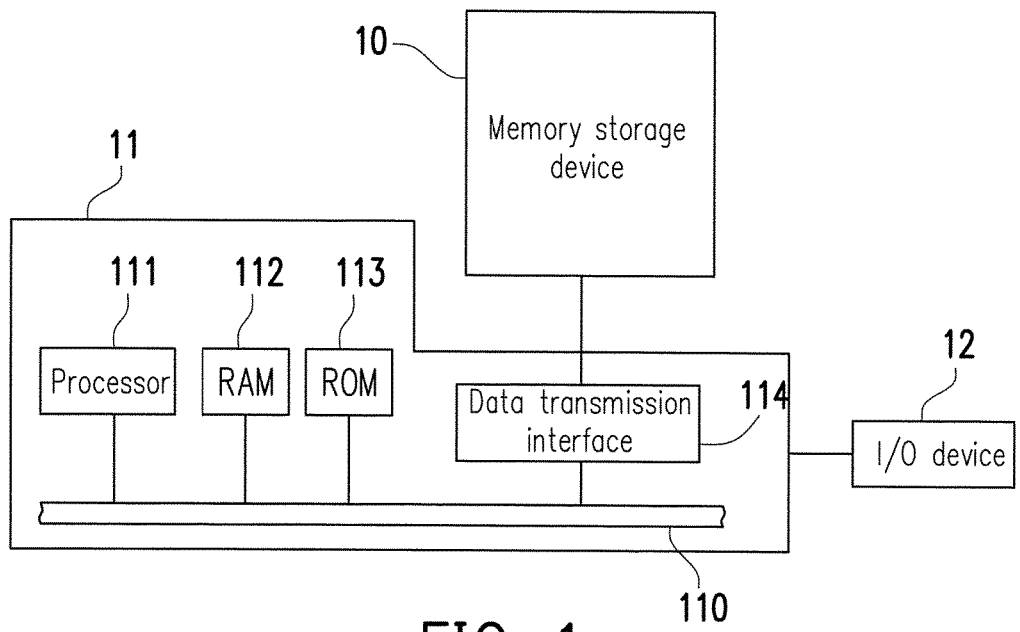
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
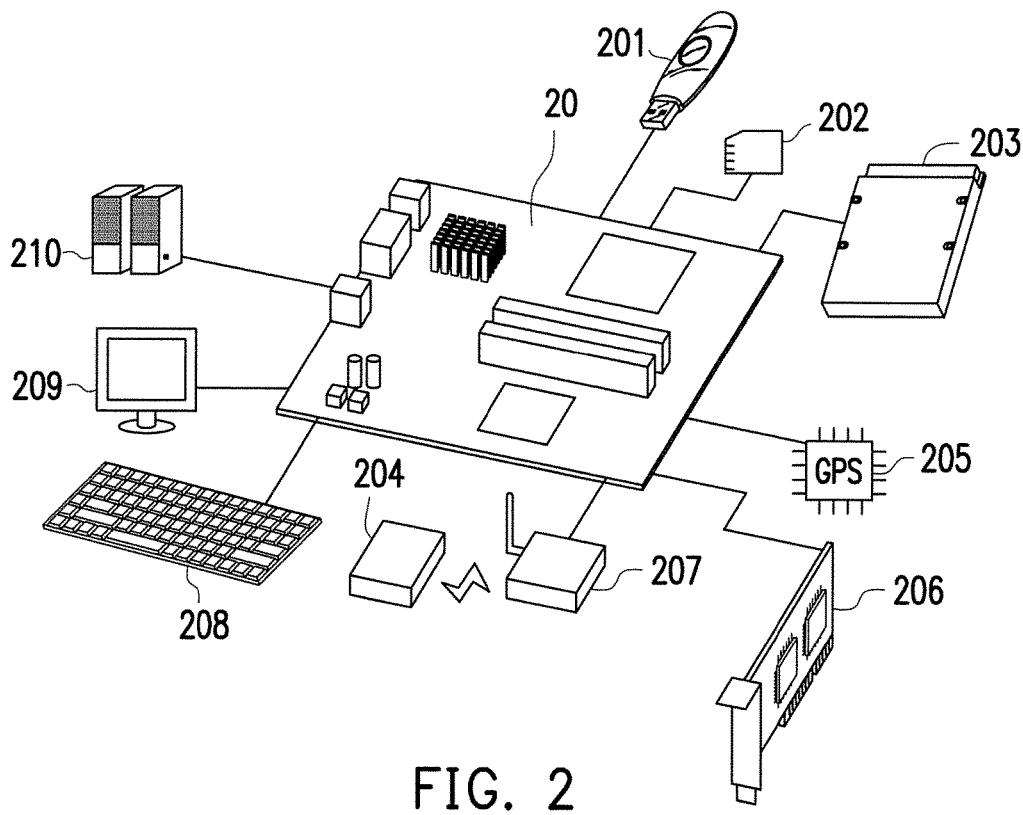
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
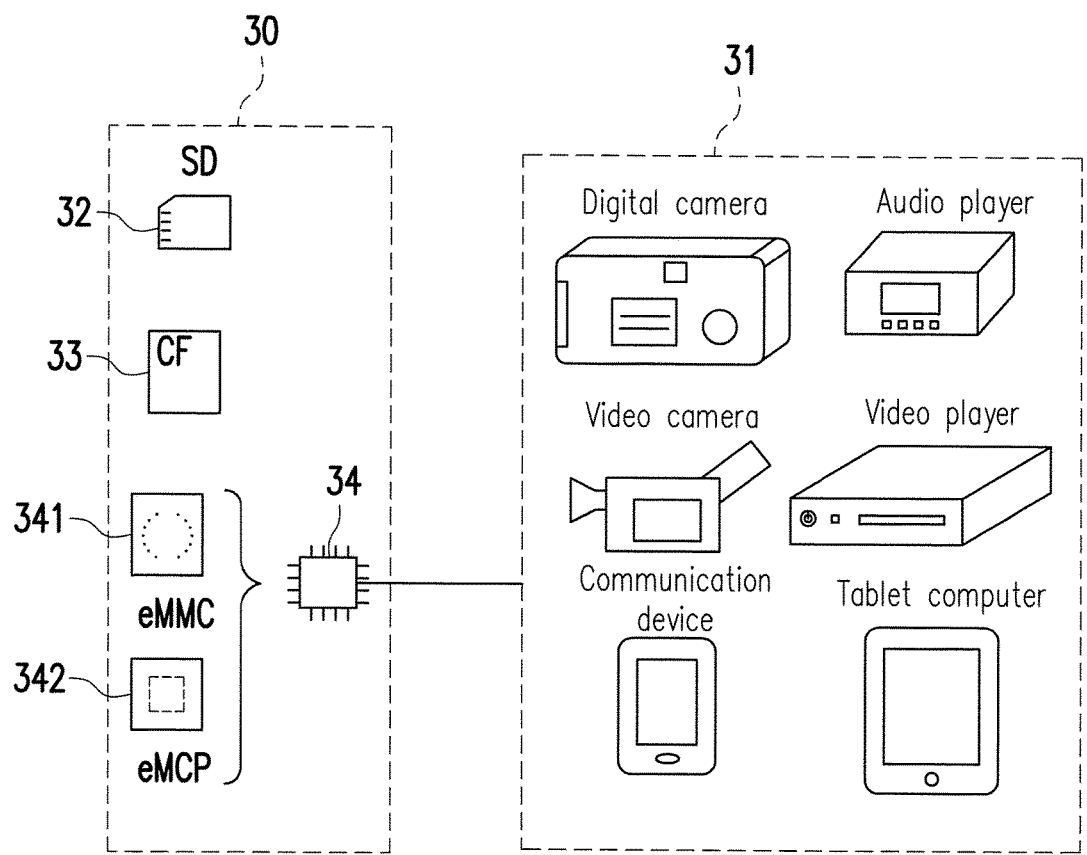
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, and a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
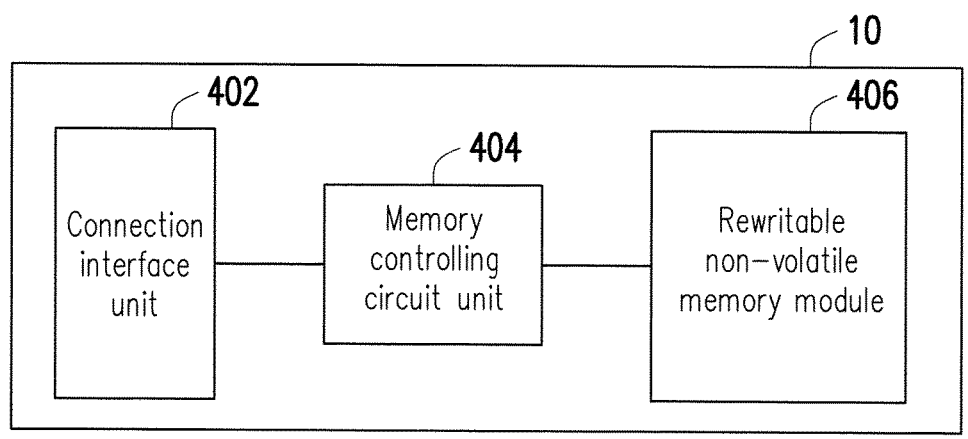
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array is described below using a two-dimensional array. However, it should be noted that, the following exemplary embodiment is simply an example of the memory cell array. In other exemplary embodiments, a disposition method of the memory cell array may be adjusted to satisfy actual requirements.

Figure 5:
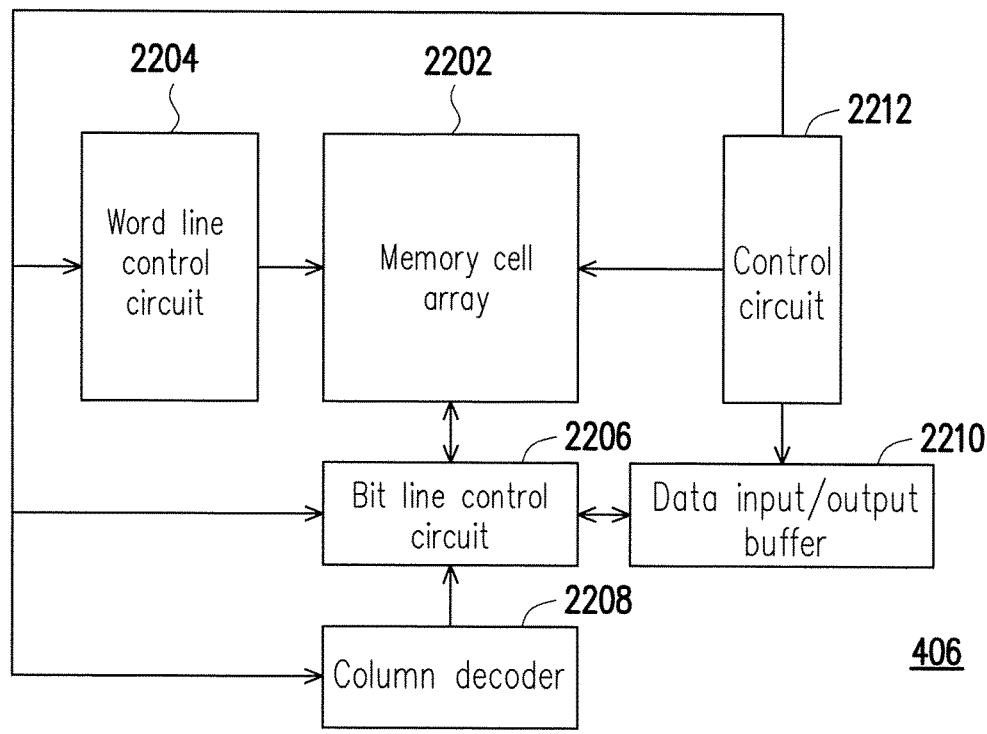
FIG. 5 is a schematic block diagram illustrating a rewritable non-volatile memory module according to an exemplary embodiment.
Figure 6:
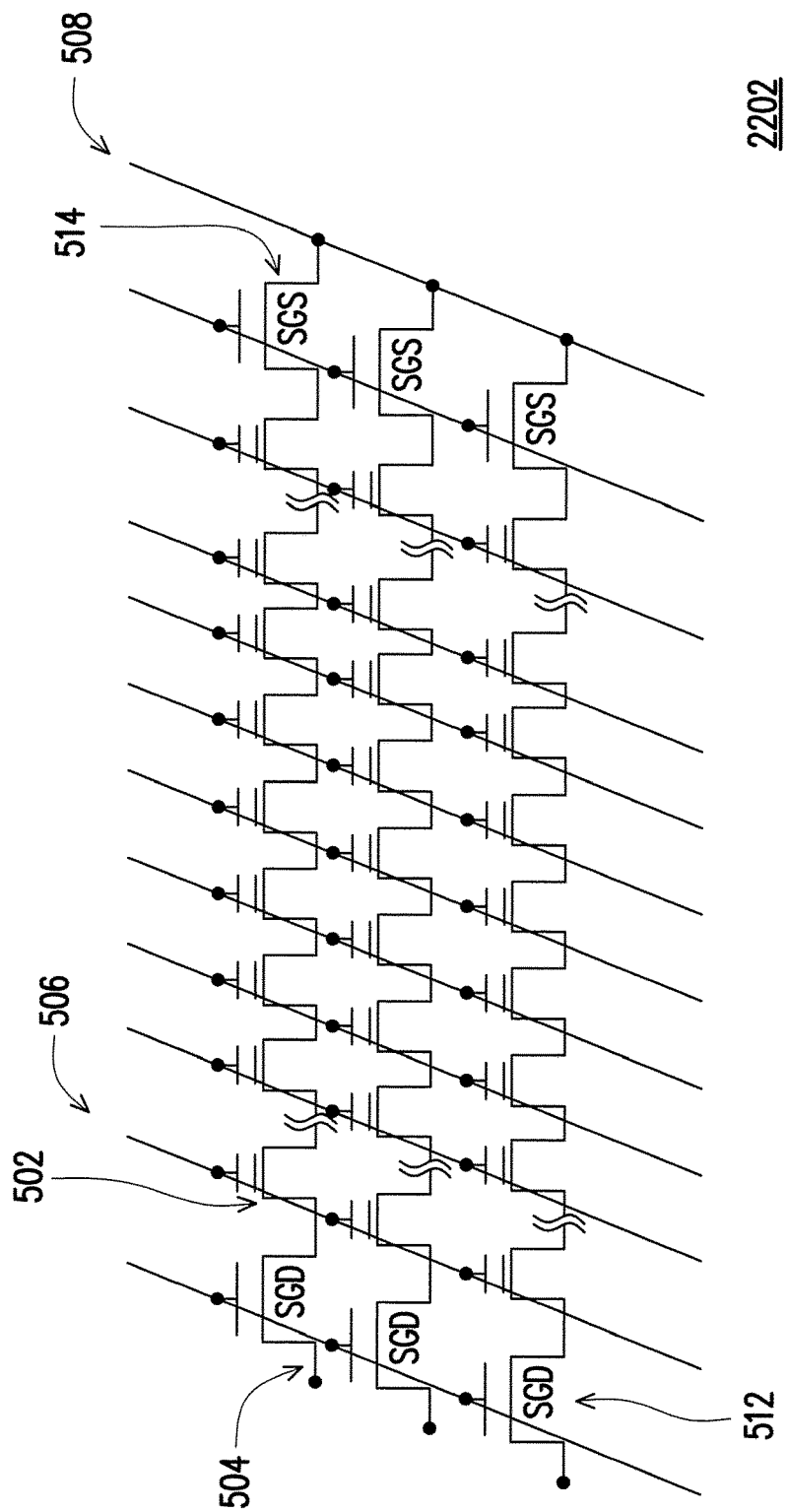
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In the present exemplary embodiment, the memory cell array 2202 may include a plurality of memory cells 502 used to store data, a plurality of select gate drain (SGD) transistors 512, a plurality of select gate source (SGS) transistors 514, as well as a plurality of bit lines 504, a plurality of word lines 506, a common source line 508 connected to the memory cells (as shown in FIG. 6). The memory cell 502 is disposed at intersections of the bit lines 504 and the word lines 506 in a matrix manner (or in a 3D stacking manner). If a write command or a read command is received from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". Each of the memory cells in the memory cell array 2022 has a plurality of storage statuses depended on changes in the threshold voltage. A read voltage can be used to determine what storage state the memory cell belongs to, so as to obtain the bit stored by the memory cell.

Figure 7:
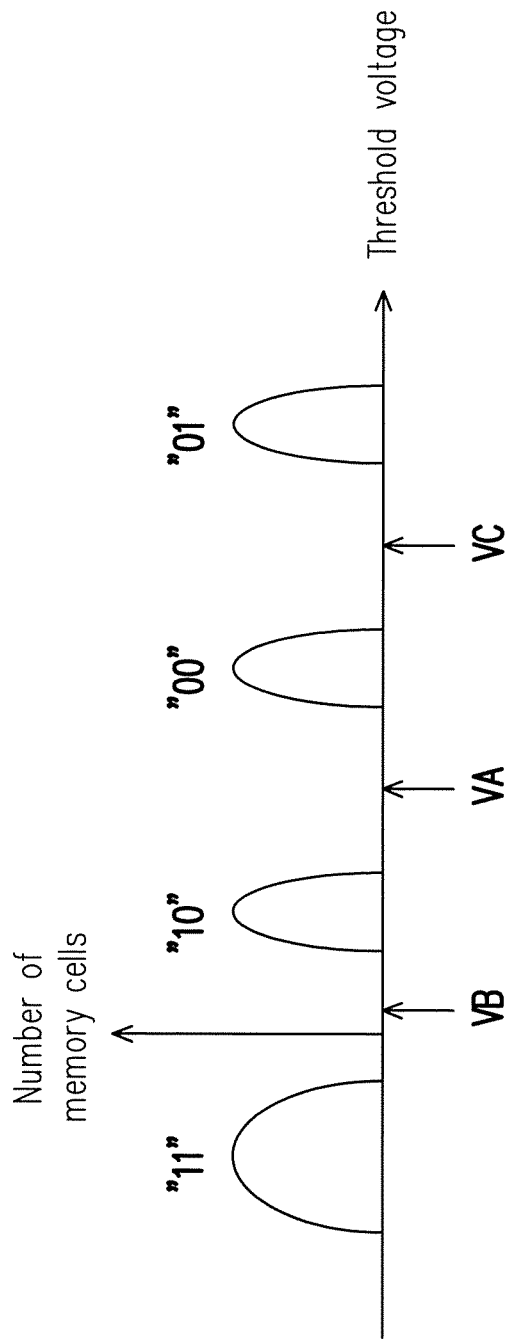
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage states depending on different threshold voltages, and the storage states represent bits "11", "10", "00" and "01", respectively. In other words, each of the storage states includes a least significant bit (LSB) and a most significant bit (MSB). In the present exemplary embodiment, among the storage states (i.e., "11", "10", "00" and "01"), a first bit counted from the left is the LSB, and a second bit counted from the left is the MSB. Accordingly, in this exemplary embodiment, each of the memory cells can store two bits. It should be understood that, the threshold voltages and the corresponding storage states illustrated in the FIG. 7 are merely an example. In another exemplary embodiment of the invention, the threshold voltages and the corresponding storage states may also have an arrangement of "11", "10", "01" and "00" that is arranged according to the threshold voltage from small to large, or have other arrangements. In addition, in another exemplary embodiment, it can also be defined that the first bit counted from the left is the MSB, and the second bit counted from the left is the LSB.

In an exemplary embodiment where one memory cell is capable of storing multiple bits (e.g., the MLC or TLC flash memory module), the physical programming units belonging to the same word line may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. In an exemplary embodiment, the lower physical programming unit is also known as a fast page, and the upper physical programming unit is also known as a slow page. In addition, in the TLC NAND flash memory module, a least significant bit (LSB) of a memory cell belongs to the lower physical programming unit, a center significant bit (CSB) of that memory cell belongs to a center physical programming unit, and a most significant bit (MSB) of that memory cell belongs to the upper physical programming unit.

Figure 8:
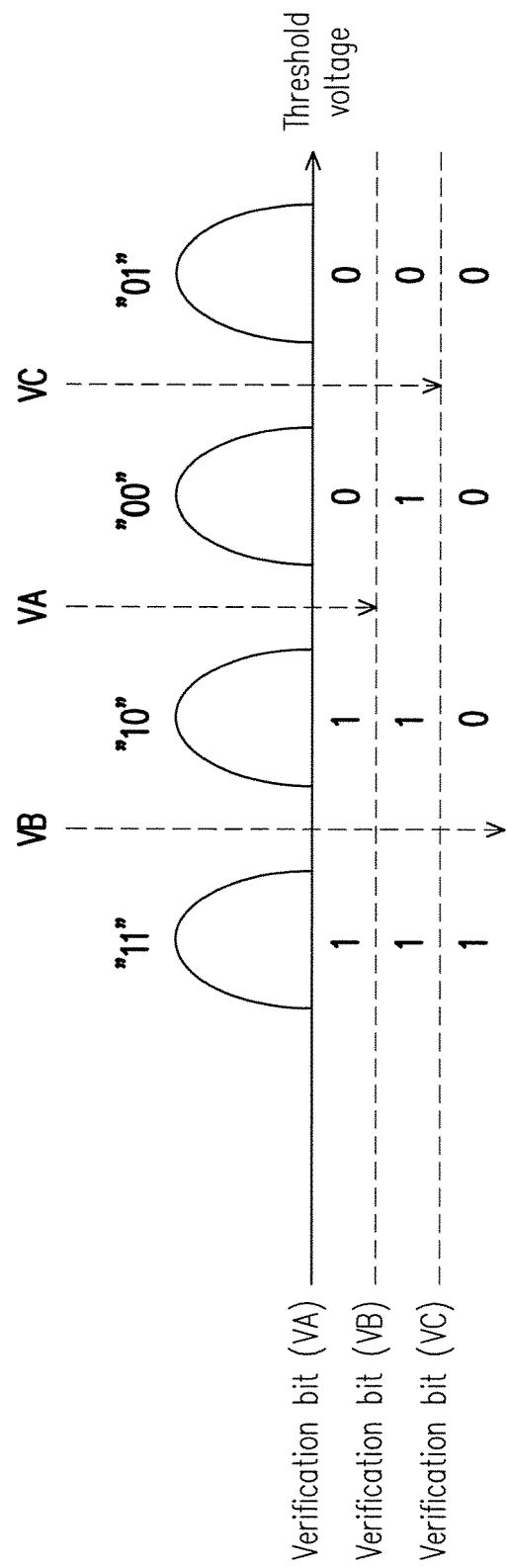
FIG. 8 illustrates a schematic diagram for reading data from a memory cell according to an exemplary embodiment.

FIG. 8 illustrates a schematic diagram for reading data from a memory cell according to an exemplary embodiment, in which a MLC NAND flash memory is used as an example.

Referring to FIG. 8, in a reading operation for the memory cells of the memory cell array 2202, read voltages VA to VC are applied to the control gate, and data stored in the memory cells are identified according whether the channel of the memory cell is turned on. A verification bit (VA) is configured to indicate whether the channel of the memory cell is turned on if a read voltage VA is applied; a verification bit (VC) is configured to indicate whether the channel of the memory cell is turned on if a read voltage VC is applied; and a verification bit (VB) is configured to indicate whether the channel of the memory cell is turned on if a read voltage VB is applied. Here, it is assumed that the corresponding memory cell channel is turned on if the verification bit is "1", and the corresponding memory cell channel is not turned on if the verification bit is "0". As shown in FIG. 8, the storage state of the memory cell may be determined according to the verification bits (VA) to (VC) so the bits stored can be obtained.

Figure 9:
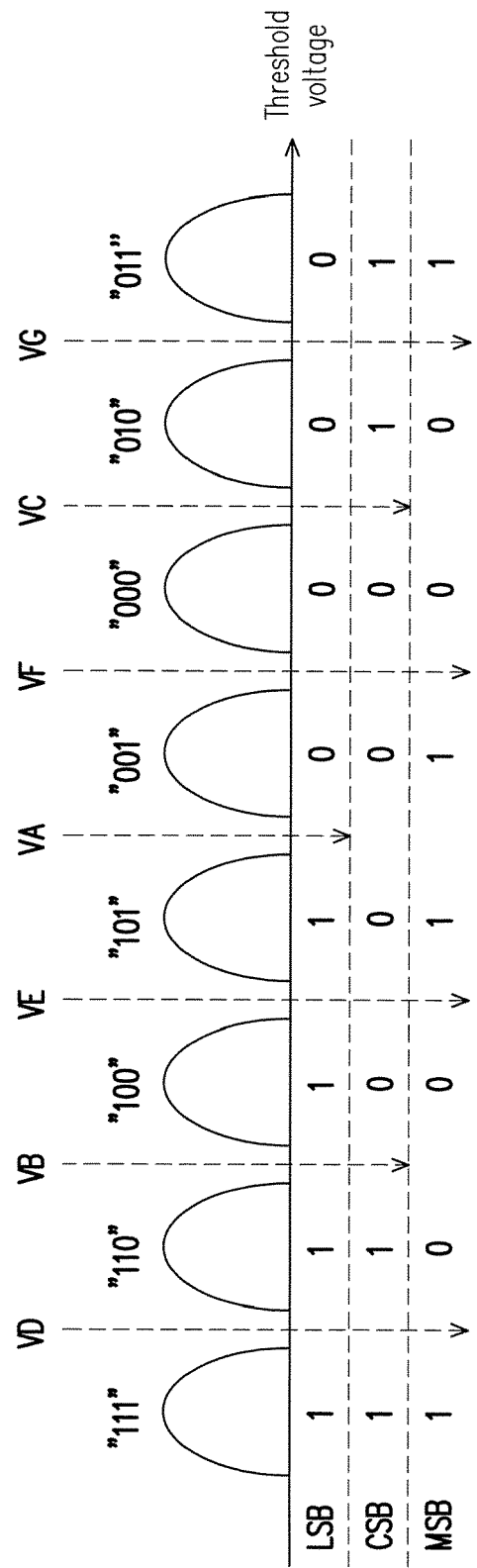
FIG. 9 illustrates a schematic diagram for reading data from a memory cell array according to another exemplary embodiment.

FIG. 9 illustrates a schematic diagram for reading data from a memory cell array according to another exemplary embodiment.

With reference to FIG. 9 that takes the TLC NAND flash memory for example, each of the storage states includes a first bit counted from the left being the least significant bit (LSB), a second bit counted from the left being a center significant bit (CSB) and a third bit counted from the left being the most significant bit (MSB). In this embodiment, the memory cell includes eight storage states depending on different threshold voltages (i.e., "111", "110", "100", "101", "001", "000", "010" and "011"). The bits stored in the memory cell may be identified by applying the read voltages VA to VC to the control gate.

Here, it should be noted that, an arranging sequence of the eight storage states in FIG. 9 may be decided based on manufacturer designs instead of being limited by the arranging sequence of this embodiment.

In addition, the memory cells of the rewritable non-volatile memory module 406 constitute a plurality of physical programming units, and the physical programming units constitute a plurality of physical erasing units. Specifically, the memory cells on the same word line in FIG. 6 constitute one or more of the physical programming units. For example, if the rewritable non-volatile memory module 406 is the MLC NAND flash memory module, the memory cells on intersections between the same word line and the bit lines constitute 2 physical programming units, i.e., the upper physical programming unit and the lower physical programming unit. In this case, one upper physical programming unit and one lower physical programming unit may be collectively referred to as a physical programming unit group. In particular, if data to be read is located in a lower physical programming unit of a physical programming unit group, the read voltage VA in FIG. 8 may be adopted to identify each bit value in the lower physical programming unit. If data to be read is located in an upper physical programming unit of a physical programming unit group, the read voltage VB and the read voltage VC in FIG. 8 may be adopted to identify each bit value in the upper physical programming unit.

Alternatively, if the rewritable non-volatile memory module 406 is the TLC NAND flash memory module, the memory cells on intersections between the same word line and the bit lines constitute 3 physical programming units, i.e., the upper physical programming unit, the center physical programming unit and the lower physical programming unit. In this case, one upper physical programming unit, one center physical programming unit and one lower physical programming unit may be collectively referred to as a physical programming unit group. In particular, if data to be read is located in a lower physical programming unit of a physical programming unit group, the read voltage VA in FIG. 9 may be adopted to identify each bit value in the lower physical programming unit. If data to be read is located in a center physical programming unit of a physical programming unit group, the read voltage VB and the read voltage VC in FIG. 9 may be adopted to identify each bit value in the center physical programming unit. If data to be read is located in an upper physical programming unit of a physical programming unit group, the read voltage VD, the read voltage VE and the read voltage VF and the read voltage VG in FIG. 9 may be adopted to identify each bit value in the upper physical programming unit.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

FIG. 10 is a schematic diagram illustrating management of physical erasing units according to an exemplary embodiment.

With reference to FIG. 10, in the present exemplary embodiment, it is assumed that one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method.

Figure 11:
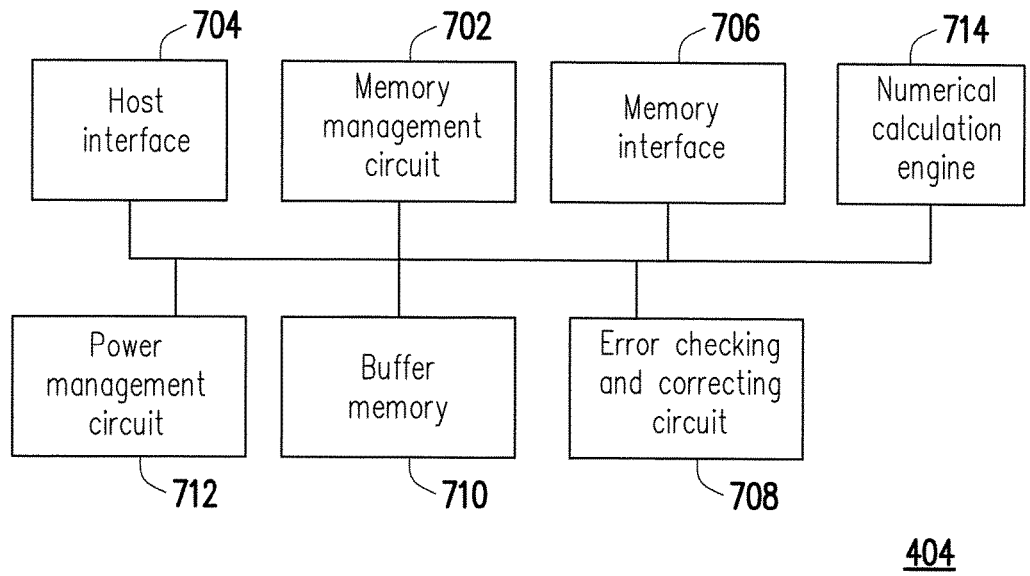
FIG. 11 is a schematic block diagram illustrating a memory controlling circuit unit according to an exemplary embodiment of the invention.

FIG. 11 is a schematic block diagram illustrating a memory controlling circuit unit according to an exemplary embodiment of the invention.

Referring to FIG. 7, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands. If the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in the form of firmware. For instance, the memory management circuit 702 has a microprocessor unit (not illustrated) and a ROM (not illustrated), and the control commands are burned into the ROM. If the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 702 if the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in a form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In the present exemplary embodiment, the host interface 704 is compatible with the SATA standard. Nevertheless, it should be understood that the invention is not limited to the above. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error checking and correcting circuit 708 is coupled to the memory management circuit 702 and configured to perform an error checking and correcting operation to ensure integrity of data. Specifically, if the memory management circuit 702 receives the write command from the host system 11, the error checking and correcting circuit 708 generates an ECC (error correcting code) and/or an EDC (error detecting code) for data corresponding to the write command, and the memory management circuit 702 writes data and the ECC and/or the EDC corresponding to the write command into the rewritable non-volatile memory module 406. Later, if reading the data from the rewritable non-volatile memory module 406, the memory management circuit 702 will read the corresponding ECC and/or the EDC, and the error checking and correcting circuit 708 will perform the error checking and correcting operation on the read data based on the ECC and/or the EDC.

In an exemplary embodiment, the memory controlling circuit unit 404 further includes a buffer memory 710, a power management circuit 712 and a numerical calculation engine 714.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In the present exemplary embodiment, the numerical calculation engine 714 is implemented in the memory controlling circuit unit 404 by, for example, a neural network (not shown) using a machine learning algorithm (or a deep learning algorithm) or other numerical calculation algorithms in hardware manner. In addition, before shipping the memory controlling circuit unit 404, the manufacturer of the memory controlling circuit unit 404 can train the neural network in the numerical calculation engine 714 to obtain a weight and a bias to be used for each layer in the neural network. For instance, after the neural network in the numerical calculation engine 714 is planned, it is required to input a large amount of input data and a solution marked in correspondence to the input data into the neural network in the numerical calculation engine 714. The neural network in the numerical calculation engine 714 can adjust the weight and the bias for each layer in the neural network according to the input data and the solution corresponding to the input data.

For instance, in an embodiment, the input data may be one specific data read from a physical programming unit, a total of bit values being 1 in that specific data, a total of the bit values being 0 in that specific data or a sum of syndromes corresponding to that specific data. In addition, the solution corresponding to the input data is, for example, an optimal read voltage for reading the physical programming unit. However, in other embodiments, the input data may also be a logical address corresponding to a write command, a sector count or a command type of the write command, and the solution corresponding to the input data is, for example, whether write data of the write command is hot data or cold data. In yet another embodiment, the input data may also be the write data corresponding to a write command, and the solution corresponding to the input data may be whether the write data is compressible or uncompressible.

After the weight and the bias are adjusted for each layer to a certain extent, if one of the input data (hereinafter, referred to as first input data) is inputted into the neural network of the numerical calculation engine 714, an output of the neural network will be very close to the solution corresponding to the first input data. At this point, the learning of the neural network in the numerical calculation engine 714 may be considered as being completed, or the neural network in the numerical calculation engine 714 may be considered as being converged.

It should be noted that, the weight and the bias for each layer the neural network may be collectively referred to as "a calculation parameter", and the manufacturer can have the calculation parameter stored in the system area (not shown) in the rewritable non-volatile memory module 406 before shipping the memory controlling circuit unit 404. Afterwards, if the rewritable non-volatile memory module 406 is powered up, the memory management circuit 702 can load the calculation parameter (a.k.a. pre-defined weight and bias) obtained through a pre-training (or learning) from the rewritable non-volatile memory module 406 into the numerical calculation engine 714 in order to perform operations required by the numerical calculation engine 714.

Furthermore, in the present exemplary embodiment, the error checking and correcting circuit 708 can perform a single-frame encoding for the data stored in the same physical programming unit and can also perform a multi-frame encoding for data stored in multiple physical programming units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error checking and correcting circuit 708 can encode the data to be protected, so as to generate the corresponding ECC and/or the EDC. For clear description, the ECC and/or the EDC generated by encoding are collectively referred to as encoded data.

Figure 12:
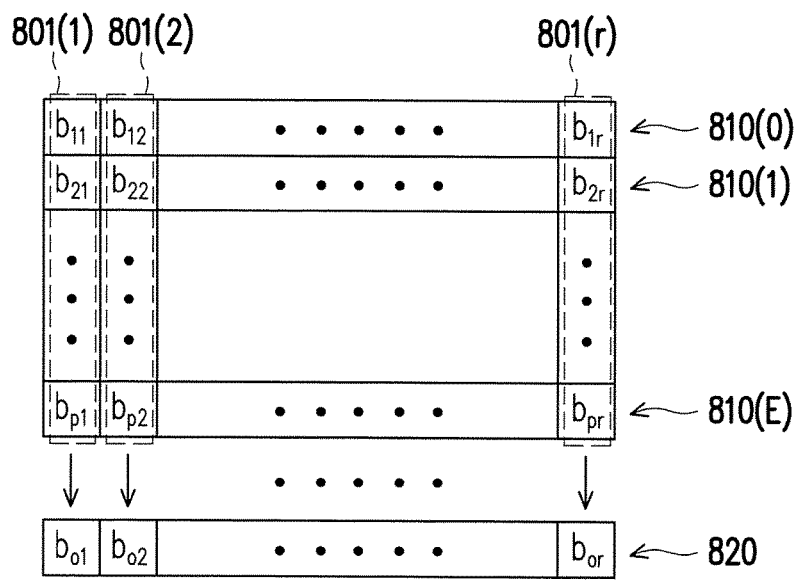
FIG. 12 is a schematic diagram illustrating a multi-frame encoding according to an exemplary embodiment of the invention.

FIG. 12 is a schematic diagram illustrating a multi-frame encoding according to an exemplary embodiment of the invention.

With reference to FIG. 12 that takes encoded data 820 correspondingly generated by encoding the data stored in physical programming units 810(0) to 810(E) as an example, in which at least a part of data stored by each of the physical programming units 810(0) to 810(E) may be regarded as one frame. In the multi-frame encoding, the data in the physical programming units 810(0) to 810(E) are encoded based on each of positions where bits (or bytes) are located. For example, bits $b_{11}, b_{21}, \ldots, b_{p1}$ at a position 801(1) are encoded as a bit $b_{o1}$ in the encoded data 820 and bits $b_{12}, b_{22}, \ldots, b_{p2}$ at a position 801(2) are encoded as a bit $b_{o2}$ in the encoded data 820; and by analogy, bits $b_{1r}, b_{2r}, \ldots, b_{pr}$ at a position 801(r) are encoded as a bit $b_{or}$ in the encoded data 820. Later, the data read from the physical programming units 810(0) to 810(E) may be decoded according to the encoded data 820 so attempts on correcting possible errors in the read data can be made.

Herein, in another exemplary embodiment of FIG. 12, the data used for generating the encoded data 820 may also include redundancy bits corresponding to the data bits in the data stored in the physical programming units 810(0) to 810(E). Taking the data stored in the physical programming unit 810(0) for example, the redundancy bits therein are, for example, encoded data generated by performing the single-frame encoding for the data bits stored in the physical programming unit 810(0). In the present exemplary embodiment, it is assumed that if the data of the physical programming unit 810(0) is read, the data read from the physical programming unit 810(0) may be decoded by the redundancy bits (e.g., the encoded data generated by using the single-frame encoding) in the physical programming unit 810(0) so as to perform the error checking and correcting operation on the read data. However, if a failure occurs if a decoding is performed by using the redundancy bits in the physical programming unit 810(0) (e.g., a number of error bits of the data stored in the physical programming unit 810(0) is greater than a threshold), a retry-read mechanism may be used to select and use other read voltages so as to attempt reading correct data from the physical programming unit 810(0). If the correct data cannot be read from the physical programming unit 810(0) by using the retry-read mechanism, the encoded data 820 and data of the physical programming units 810(1) to 810(E) may be read and the decoding may be performed according to the encoded data 820 and the data of the physical programming units 810(1) to 810(E) so as to attempt correcting errors included in the data stored in the physical programming unit 810(0). In other words, in the present exemplary embodiment, if a failure occurs if the decoding is performed by using the encoded data generated by the single-frame encoding and a failure occurs if the reading is performed by using the retry-read mechanism, the encoded data generated by the multi-frame encoding is used for the decoding instead.

It is noted that in the following description, some terms may be replaced with corresponding abbreviations for ease of reading (see Table 1).

TABLE 1

| rewritable non-volatile memory module | RNVM module |
| physical erasing unit | PEU |

TABLE 1-continued

| lower physical programming unit | LPPU |
| center physical programming unit | CPPU |
| upper physical programming unit | UPPU |
| physical programming unit | PPU |
| physical programming unit group | PPUG |
| memory management circuit | MMC |
| memory control circuit | MCC |
| error checking and correcting circuit | ECCC |
| read voltage group | RVG |

In the present exemplary embodiment, the MMC 702 configures a preset RVG for the rewritable non-volatile memory 406. For example, in an example where the RNVM module 406 is an eight-layer cell NAND memory module, the preset RVG includes a plurality of voltages such as the read voltages VA to VG in FIG. 9. Also, if reading the rewritable non-volatile memory 406, the MMC 702 first adopts the read voltages in the preset RVG to read data stored in the rewritable non-volatile memory 406.

For example, FIG. 13 is a schematic diagram illustrating an example of multiple PPUGs in a PEU according to an exemplary embodiment.

With reference to FIG. 13, if reading data stored in one PPU, the MMC 702 first adopts the preset RVG (e.g., the read voltages VA to VG in FIG. 9) to read the data.

For example, if the MMC 702 attempts to read data from a LPPU L_0 (a.k.a. a first PPU) in a PPUG 1301, the MMC 702 first adopts the read voltage VA (a.k.a. a first read voltage) in the preset RVG to read the data (referred to as first data hereinafter) from the LPPU L_0. For example, the MMC 702 adopts the read voltage VA in the preset RVG to identify each bit value in the PPU.

After the data is completely read, the MMC 702 may perform the retry-read mechanism by directly using another read voltage to read data from the LPPU L_0.

However, in another exemplary embodiment, the error checking and correcting operation may also be performed first by the ECCC 708 according to an error checking and correcting code (i.e., the redundancy bits) corresponding to the read first data. Here, the redundancy bits (a.k.a. first encoded data) are generated by the single-frame encoding. In the error checking and correcting operation, the MMC 702 performs a decoding operation corresponding to the single-frame encoding (a.k.a. a first decoding operation) to correct errors in the first data according to the first encoded data. If error bits in the first data cannot be completely corrected by using the first encoded data, the MMC 702 determines that the data in the LPPU L_0 cannot be correctly obtained. Only then, the MMC 702 uses the retry-read mechanism to retry reading the data from the LPPU L_0.

For example, FIG. 14 is a schematic diagram illustrating a RVG for a retry-read mechanism according to an exemplary embodiment of the invention.

Referring to FIG. 13 and FIG. 14 together, in the present exemplary embodiment, the MMC 702 pre-configures (or sets) RVGs RR_1 to RR_n for the retry-read mechanism. Each voltage group among the RVGs RR_1 to RR_n includes a plurality of read voltages. For example, the RVG RR_1 may include a read voltage VA_1 for reading the LPPU, a read voltage VB_1 and a read voltage VC_1 for reading the CPPU and a read voltage VD_1, a read voltage VE_1, a read voltage VF_1 and a read voltage VG_1 for reading the UPPU. The RVG RR_2 may include a read voltage VA_2 for reading the LPPU, a read voltage VB_2 and a read voltage VC_2 for reading the CPPU and a read voltage VD_2, a read voltage VE_2, a read voltage VF_2 and a read voltage VG_2 for reading the UPPU. The RVG RR_3 may include a read voltage VA_3 for reading the LPPU, a read voltage VB_3 and a read voltage VC_3 for reading the CPPU and a read voltage VD_3, a read voltage VE_3, a read voltage VF_3 and a read voltage VG_3 for reading the UPPU. The RVG RR_n may include a read voltage VA_n for reading the LPPU, a read voltage VB_n and a read voltage VC_n for reading the CPPU and a read voltage VD_n, a read voltage VE_n, a read voltage VF_n and a read voltage VG_n for reading the UPPU. It should be noted that, the MMC 702 may also pre-configure (or set) more or fewer RVGs for the retry-read mechanism.

In the retry read mechanism, the MMC 702 sequentially selects the RVGs from the RVGs RR_1 to RR_n, and retries reading the data from the LPPU L_0 according to the voltages in the selected RVG. For example, the MMC 702 first selects the RVG RR_1 to perform a retry-read for the first time. The MMC 702 reads the LPPU L_0 to obtain data (a.k.a. second data) according to the read voltage VA_1 (a.k.a. a second read voltage) in the RVG RR_1. Here, it should be noted that, if the same PPU (e.g., the LPPU L_0) is read by using different read voltages, the numbers of error bits (or error rates) of the obtained data may be different from each other.

In an embodiment, after reading the second data from the LPPU L_0 by using the read voltage VA_1, the MMC 702 may select an optimal read voltage (a.k.a. a third read voltage) for reading the LPPU L_0 by the numerical calculation engine 714. Specifically, the MMC 702 may input a first state parameter corresponding to the first data and a second state parameter corresponding to the second data into the numerical calculation engine 714. Afterwards, the numerical calculation engine 714 determines one optimal read voltage for reading LPPU L_0 among the RVGs RR_1 to RR_n according to, for example, the first state parameter, the second state parameter and the pre-defined weight and the bias previously loaded into the numerical calculation engine 714. Here, it is assumed that the optimal read voltage for reading the LPPU L_0 deduced by the numerical calculation engine 714 according to the first state parameter and the second state parameter is the read voltage VA_n of the RVG RR_n.

It should be noted that, the first state parameter may include the first data, a total of bit values being 1 in the first data, a total of the bit values being 0 in the first data or a sum of syndromes (a.k.a. first syndromes) corresponding to the first data. Here, the first syndromes are, for example, a plurality of syndromes generated by using a parity check matrix multiplied by the read first data during a LDPC code decoding. The calculating method for the syndromes may be obtained from the conventional technology, and thus description regarding the same is not repeated hereinafter.

Similarly, the second state parameter may include the second data, a total of bit values being 1 in the second data, a total of the bit values being 0 in the second data or a sum of syndromes (a.k.a. second syndromes) corresponding to the second data. Here, the second syndromes are, for example, a plurality of syndromes generated by using a parity check matrix multiplied by the read second data during a LDPC code decoding. The calculating method for the syndromes may be obtained from the conventional technology, and thus description regarding the same is not repeated hereinafter.

It should be noted that, in the present exemplary embodiment, types of the first state parameter and the second state parameter are the same. More specifically, if the first state parameter is the first data, the second state parameter is the second data; if the first state parameter is the total of the bit values being 1 in the first data, the second state parameter is the total of the bit values being 1 in the second data; if the first state parameter is the total of the bit values being 0 in the first data, the second state parameter is the total of the bit values being 0 in the second data; if the first state parameter is the sum of the syndromes corresponding to the first data, the second state parameter is the sum of the syndromes corresponding to the second data. However, the invention is not limited to the above. In other embodiments, the types of the first state parameter and the second state parameter may also be different.

However, in another exemplary embodiment, the error checking and correcting operation may also be performed first by the ECCC 708 according to an error checking and correcting code (i.e., the redundancy bits, which is also referred to as second encoded data hereinafter) corresponding to the read second data. Here, the second encoded data is generated by the single-frame encoding. In the error checking and correcting operation, the MMC 702 performs the decoding operation corresponding to the single-frame encoding (a.k.a. a first decoding operation) to correct errors in the second data according to the second encoded data. It is assumed that the MMC 702 is still unable to completely correct the error bits in the second data after performing the first decoding operation, and only then, the MMC 702 performs the operation of deducing the optimal read voltage for reading the LPPU L_0 by inputting the first state parameter corresponding to the first data and the second state parameter corresponding to the second data into the numerical calculation engine 714.

In other words, in an embodiment, after the MMC 702 obtains the first data by using the read voltage VA and obtains the second data by using the read voltage VA_1, the MMC 702 may then perform the operation of deducing the optimal read voltage for reading the LPPU L_0 by inputting the first state parameter corresponding to the first data and the second state parameter corresponding to the second data into the numerical calculation engine 714. Nonetheless, in another embodiment, the MMC 702 performs the operation of deducing the optimal read voltage for reading the LPPU L_0 by inputting the first state parameter corresponding to the first data and the second state parameter corresponding to the second data into the numerical calculation engine 714 only if the first data and the second data both include an uncorrectable error.

It should be noted that, in the foregoing embodiment, the first read voltage is a read voltage in the preset RVG (i.e., the read voltage VA) and the second read voltage is a read voltage in the RVG RR_1 (i.e., the read voltage VA_1). However, the invention is not limited to the above. In another embodiment, the first read voltage may also be a read voltage in the RVGs RR_1 to RR_n (e.g., the read voltage VA_1) and the second read voltage may be another read voltage in the RVGs RR_1 to RR_n (e.g., the read voltage VA_2). The invention is not intended to limit sources of the first read voltage and the second read voltage.

In other words, in the traditional retry-read mechanism, the MMC 702 may need to sequentially try and use all of the RVGs RR_1 to RR_n before the optimal read voltage for reading the LPPU L_0 (i.e., the read voltage VA_n of the RVG RR_n) can eventually be obtained. However, with the numerical calculation engine 714 of the invention, the MMC 702 is able to rapidly obtain the optimal read voltage for reading the LPPU L_0 without trying all of the RVGs RR_1 to RR_n. It should be noted that, the invention is not intended to limit a number of times for the retry-read. In other embodiments, it is also possible that the retry-read is performed even more (or fewer) times before the optimal read voltage is obtained by inputting the first state parameter and the second state parameter (or even more state parameters) into the numerical calculation engine 714 for deducing.

After the numerical calculation engine 714 obtains the optimal read voltage for reading the LPPU L_0 (e.g., the read voltage VA_n), the numerical calculation engine 714 can then output the read voltage VA_n to the MMC 702. Afterwards, the MMC 702 may read the LPPU L_0 to obtain data (a.k.a. third data) by using the read voltage VA_n.

Afterwards, the ECCC 708 may perform the error checking and correcting operation according to an error checking and correcting code (i.e., the redundancy bits, which is also referred to as third encoded data hereinafter) corresponding to the read third data. Here, the third encoded data is generated by the single-frame encoding. In the error checking and correcting operation, the MMC 702 performs the decoding operation corresponding to the single-frame encoding (a.k.a. the first decoding operation) to correct errors in the third data according to the third encoded data.

If the MMC 702 checks the third data according to the third encoded and determines that the third data does not include errors, the MMC 702 may output the read third data to the host system 11. Other than that, if the MMC 702 is able to correct the errors in the third data according to the third encoded data, the MMC 702 may also output the third data with the errors corrected to the host system 11. However, if the third data includes the errors cannot be corrected by the third encoded data, the MMC 702 determines that a failure occurs if the LPPU L_0 is read by using the first decoding operation. In other words, if the MMC 702 determines that the correct data cannot be read from the LPPU by the retry-read mechanism, the MMC 702 determines that a failure occurs if the decoding is performed by using the encoded data generated by the single-frame encoding. Then, the MMC 702 uses the encoded data generated by the multi-frame encoding instead.

In view of the above, if the data is read from the RNVM module 406 in the invention, the numerical calculation engine 714 can be used to determine at least one optimal read voltage for reading the PPU so the time spent in the retry-read mechanism may be reduced and the accessing efficiency of the RNVM module 406 may be improved.

It should be noted that, although the numerical calculation engine 714 is used to deduce the optimal read voltage for reading the LPPU in the foregoing exemplary embodiments, the invention is not limited thereto. In other embodiments, the numerical calculation engine 714 may also be used to deduce the optimal read voltage for reading the CPPU or the UPPU. Further, although the TLC NAND flash memory module is used as an example in the foregoing exemplary embodiments, the invention is not limited thereto. In other embodiments, the data accessing method of the invention may also be applied to the SLC NAND flash memory module or the MLC NAND flash memory module.

In particular, in an embodiment, the numerical calculation engine 714 may also be used in a situation where the host system 11 gives a write command to the MMC 702. In detail, if the MMC 702 receives the write command (a.k.a. a first write command) from the host system 11, the MMC 702 may input a state parameter corresponding to the first write command (a.k.a. a third state parameter) into the numerical calculation engine 714. Afterwards, the numerical calculation engine 714 may determine a type of write data (a.k.a. first write data) corresponding to the first write command according to the third state parameter.

In detail, in an embodiment, the third state parameter includes a logical address for writing the first write data (a.k.a. a first logical address), a physical address, a sector count or a command type of the first write command. The numerical calculation engine 714 may determine whether the first write data is hot data or clod data according to the third state parameter. Here, an access frequency of the hot data is higher than an access frequency of the cold data. In an embodiment, for example, the MMC 702 may store data identified as the hot data into the buffer memory 710 of the memory controlling circuit unit 404 which is accessed more often (more robust) rather than temporarily storing the data identified as the hot data into the RNVM module 406. However, in another embodiment, for example, the MMC 702 may write the data identified as the hot data into the RNVM module 406 by using a single-page programming mode. Here, the memory cell written by using the single-page programming mode in the RNVM module 406 only stores data of one bit. In addition, for example, the MMC 702 may directly (or immediately) store data identified as the cold data into the RNVM module 406 and delete the data identified as the cold data temporarily stored in the buffer memory 710. In an embodiment, for example, the MMC 702 may directly write the data identified as the cold data into the RNVM module 406 by using a multi-page programming mode, and the memory cell written by using the multi-page programming mode stores data of multiple bits.

Moreover, in an embodiment, the third state parameter may also include the first write data. The numerical calculation engine 714 can determine whether the first write data is compressible or uncompressible according to the first write data. It should be noted that, whether one data is compressible or uncompressible may be learnt by conventional methods, which are not repeated hereinafter. If the numerical calculation engine 714 determines that the first write data is compressible, the numerical calculation engine 714 may determine a compression rate of the first write data and output the compression rate to the MMC 702. Afterwards, the MMC 702 may compress the first write data according to the compression rate outputted by the numerical calculation engine 714.

Figure 15:
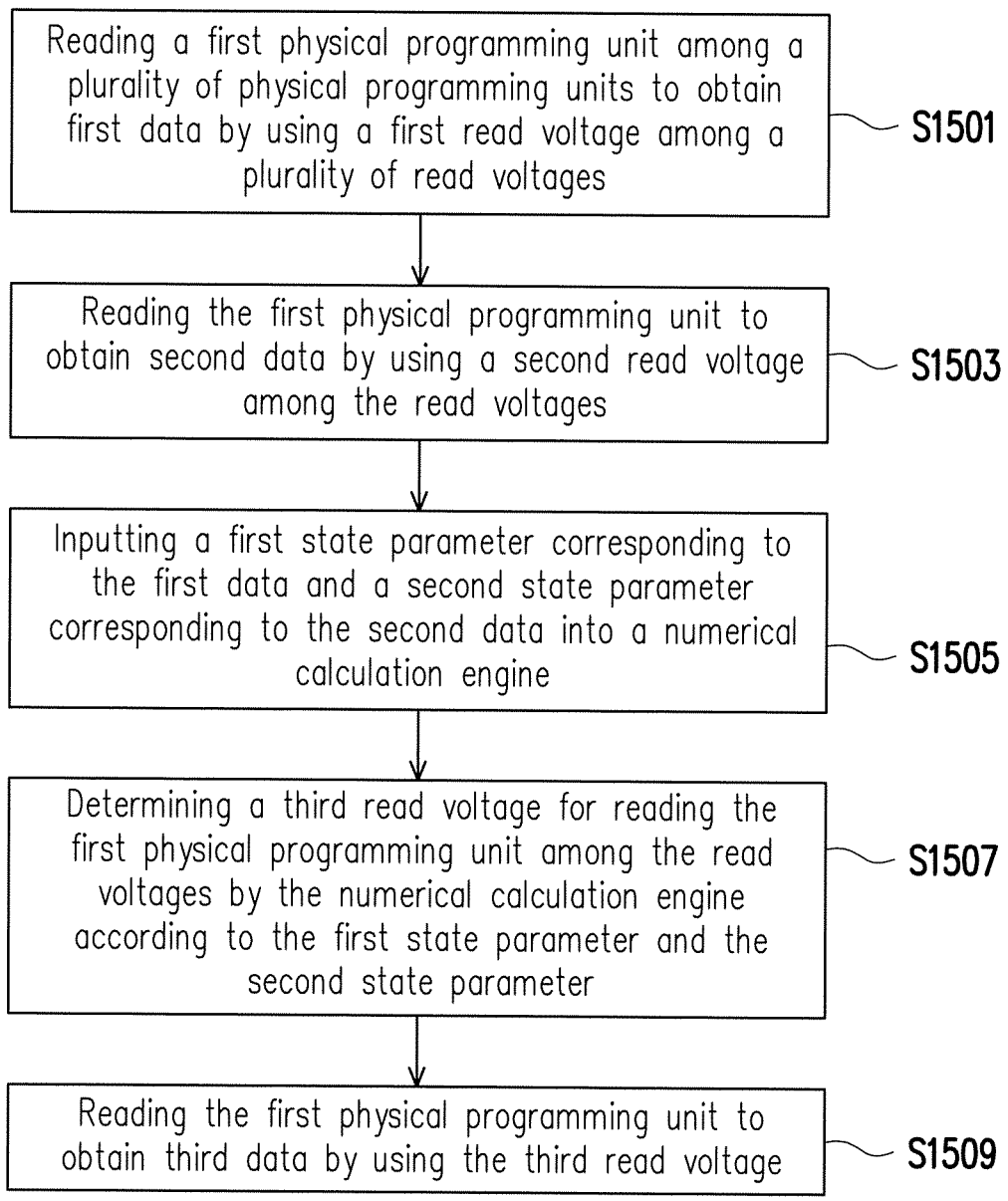
FIG. 15 is a flowchart illustrating a data accessing method according to an exemplary embodiment.

FIG. 15 is a flowchart illustrating a data accessing method according to an exemplary embodiment.

With reference to FIG. 15, in step S1501, the MMC 702 reads a first PPU among a plurality of PPUs to obtain first data by using a first read voltage among a plurality of read voltages. In step S1503, the MMC 702 reads the first PPU to obtain second data by using a second read voltage among the read voltages. In step S1505, the MMC 702 inputs a first state parameter corresponding to the first data and a second state parameter corresponding to the second data into the numerical calculation engine 714. Next, in step S1507, the numerical calculation engine 714 determines an optimal read voltage for reading the first PPU among the read voltages according to the first state parameter and the second state parameter. Lastly, in step S1509, the MMC 702 reads the first PPU to obtain third data by using the optimal read voltage.

In summary, if the data is read from the RNVM module according to the data accessing method of the invention, the optimal read voltage for reading one PPU may be determined by using the numerical calculation engine so the time spent in the retry-read mechanism may be reduced and the accessing efficiency of the RNVM module may be improved. In addition, if the RNVM module is being written, other than the capability of determining whether the write data is the hot data or the cold data by the numerical calculation engine, whether the write data is compressible may also be determined by the numerical calculation engine. Accordingly, if the data is written, the MMC is able to select the best way for writing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data accessing method for a rewritable non-volatile memory module, the rewritable non-volatile memory module having a plurality of physical erasing units, each physical erasing unit among the physical erasing units having a plurality of physical programming units, the data accessing method comprising:
   reading a first physical programming unit among the physical programming units to obtain first data by using at least one first read voltage among a plurality of read voltages;
   reading the first physical programming unit to obtain second data by using at least one second read voltage among the read voltages;
   inputting a first state parameter corresponding to the first data and a second state parameter corresponding to the second data into a numerical calculation engine;
   determining a third read voltage for reading the first physical programming unit among the read voltages by the numerical calculation engine according to the first state parameter and the second state parameter; and
   reading the first physical programming unit to obtain third data by using the third read voltage.

2. The data accessing method of claim 1, wherein the step of reading the first physical programming unit among the physical programming units to obtain the first data by using the first read voltage among the read voltages comprises:
   performing a first decoding operation to correct errors in the first data according to first encoded data, and performing the step of reading the first physical programming unit to obtain the second data by using the second read voltage among the read voltages if the first data includes an uncorrectable error,
   wherein the step of reading the first physical programming unit to obtain the second data by using the second read voltage among the read voltages comprises:
   performing the first decoding operation to correct errors in the second data according to second encoded data, and performing the step of inputting the first state parameter corresponding to the first data and the second state parameter corresponding to the second data into the numerical calculation engine if the second data includes the uncorrectable error.

3. The data accessing method of claim 2, further comprising:
   performing the first decoding operation to correct errors in the third data according to third encoded data, and outputting the third data if the third data does not include the errors;
   if the errors in the third data are corrected, outputting the third data with the errors corrected; and
   determining that a failure occurs if the first physical programming unit is read by using the first decoding operation if the third data includes the uncorrectable error.

4. The data accessing method of claim 1, wherein the third read voltage is an optimal read voltage for reading the first physical programming unit.

5. The data accessing method of claim 1, wherein the first state parameter comprises the first data, a total of bit values being 1 in the first data, a total of the bit values being 0 in the first data or a sum of first syndromes corresponding to the first data.

6. The data accessing method of claim 1, wherein the second state parameter comprises the second data, a total of bit values being 1 in the second data, a total of the bit values being 0 in the second data or a sum of second syndromes corresponding to the second data.

7. The data accessing method of claim 1, further comprising:
   loading at least one calculation parameter obtained through a pre-training from the rewritable non-volatile memory module into the numerical calculation engine if the rewritable non-volatile memory module is powered up.

8. The data accessing method of claim 7, wherein the calculation parameter comprises a pre-defined weight or a bias, wherein the step of determining the third read voltage for reading the first physical programming unit among the read voltages by the numerical calculation engine according to the first state parameter and the second state parameter comprises:
   determining the third read voltage by the numerical calculation engine according to the first state parameter, the second state parameter and the pre-defined weight or the bias.

9. The data accessing method of claim 1, further comprising:
   receiving a first write command from a host system;
   inputting a third state parameter corresponding to the first write command into the numerical calculation engine; and
   determining a type of first write data corresponding to the first write command by the numerical calculation engine according to the third state parameter.

10. The data accessing method of claim 9, wherein the third state parameter comprises a first logical address, a location parameter or a command type corresponding to the first write data, wherein the step of determining the type of the first write data corresponding to the first write command by the numerical calculation engine according to the third state parameter comprises:
    determining whether the first write data is hot data or clod data by the numerical calculation engine according to the third state parameter, wherein an access frequency of the hot data is higher than an access frequency of the cold data.

11. A memory controlling circuit unit for controlling a rewritable non-volatile memory module, the rewritable non-volatile memory module having a plurality of physical erasing units, each physical erasing unit among the physical erasing units having a plurality of physical programming units, the memory controlling circuit unit comprising:
    a host interface, configured to couple to a host system;
    a memory interface, configured to couple to a rewritable non-volatile memory module;
    a numerical calculation engine; and a memory management circuit, coupled to the host interface, the memory interface and the numerical calculation engine, wherein the memory management circuit is configured to read a first physical programming unit among the physical programming units to obtain first data by using at least one first read voltage among a plurality of read voltages, wherein the memory management circuit is further configured to read the first physical programming unit to obtain second data by using at least one second read voltage among the read voltages, wherein the memory management circuit is further configured to input a first state parameter corresponding to the first data and a second state parameter corresponding to the second data into the numerical calculation engine, and the numerical calculation engine is configured to determine a third read voltage for reading the first physical programming unit among the read voltages according to the first state parameter and the second state parameter, wherein the memory management circuit is further configured to read the first physical programming unit to obtain third data by using the third read voltage.

12. The memory controlling circuit unit of claim 11, wherein in the operation of reading the first physical programming unit among the physical programming units to obtain the first data by using the first read voltage among the read voltages, the memory management circuit performs a first decoding operation to correct errors in the first data according to first encoded data, and performs the operation of reading the first physical programming unit to obtain the second data by using the second read voltage among the read voltages if the first data includes an uncorrectable error, wherein in the operation of reading the first physical programming unit to obtain the second data by using the second read voltage among the read voltages, the memory management circuit performs the first decoding operation to correct errors in the second data according to second encoded data, and performs the operation of inputting the first state parameter corresponding to the first data and the second state parameter corresponding to the second data into the numerical calculation engine if the second data includes the uncorrectable error.

13. The memory controlling circuit unit of claim 12, wherein the memory management circuit performs the first decoding operation to correct errors in the third data according to third encoded data, the memory management circuit outputs the third data if the third data does not include the errors, if the errors in the third data are corrected, the memory management circuit outputs the third data with the errors corrected, and the memory management circuit determines that a failure occurs if the first physical programming unit is read by using the first decoding operation if the third data includes the uncorrectable error.

14. The memory controlling circuit unit of claim 11, wherein the third read voltage is an optimal read voltage for reading the first physical programming unit.

15. The memory controlling circuit unit of claim 11, wherein the first state parameter comprises the first data, a total of bit values being 1 in the first data, a total of the bit values being 0 in the first data or a sum of first syndromes corresponding to the first data.

16. The memory controlling circuit unit of claim 11, wherein the second state parameter comprises the second data, a total of bit values being 1 in the second data, a total of the bit values being 0 in the second data or a sum of second syndromes corresponding to the second data.

17. The memory controlling circuit unit of claim 11, wherein the memory management circuit loads at least one calculation parameter obtained through a pre-training from the rewritable non-volatile memory module into the numerical calculation engine if the rewritable non-volatile memory module is powered up.

18. The memory controlling circuit unit of claim 17, wherein the calculation parameter comprises a pre-defined weight or a bias, wherein in the operation of determining the third read voltage for reading the first physical programming unit among the read voltages by the numerical calculation engine according to the first state parameter and the second state parameter, the numerical calculation engine determines the third read voltage according to the first state parameter, the second state parameter and the pre-defined weight or the bias.

19. The memory controlling circuit unit of claim 11, wherein the memory management circuit receives a first write command from the host system, the memory management circuit inputs a third state parameter corresponding to the first write command into the numerical calculation engine, and the numerical calculation engine determines a type of first write data corresponding to the first write command according to the third state parameter.

20. The memory controlling circuit unit of claim 19, wherein the third state parameter comprises a first logical address, a location parameter or a command type corresponding to the first write data, wherein in the operation of determining the type of the first write data corresponding to the first write command by the numerical calculation engine according to the third state parameter, the numerical calculation engine determines whether the first write data is hot data or clod data according to the third state parameter, wherein an access frequency of the hot data is higher than an access frequency of the cold data.

21. A memory storage device, comprising:

a connection interface unit, configured to couple to a host system;

a rewritable non-volatile memory module having a plurality of physical erasing units, each physical erasing unit among the physical erasing units having a plurality of physical programming units; and a memory controlling circuit unit, coupled to the connection interface unit and the rewritable non-volatile memory module, and having a numerical calculation engine, wherein the memory controlling circuit unit is configured to read a first physical programming unit among the physical programming units to obtain first data by using at least one first read voltage among a plurality of read voltages, wherein the memory controlling circuit unit is further configured to read the first physical programming unit to obtain second data by using at least one second read voltage among the read voltages, wherein the memory controlling circuit unit is further configured to input a first state parameter corresponding to the first data and a second state parameter corresponding to the second data into the numerical calculation engine, and determine a third read voltage for reading the first physical programming unit among the read voltages by the numerical calculation engine according to the first state parameter and the second state parameter, wherein the memory controlling circuit unit is further configured to read the first physical programming unit to obtain third data by using the third read voltage.

22. The memory storage device of claim 21, wherein in the operation of reading the first physical programming unit among the physical programming units to obtain the first data by using the first read voltage among the read voltages, the memory controlling circuit unit performs a first decoding operation to correct errors in the first data according to first encoded data, and performs the operation of reading the first physical programming unit to obtain the second data by using the second read voltage among the read voltages if the first data includes an uncorrectable error, wherein in the operation of reading the first physical programming unit to obtain the second data by using the second read voltage among the read voltages, the memory controlling circuit unit performs the first decoding operation to correct errors in the second data according to second encoded data, and performs the operation of inputting the first state parameter corresponding to the first data and the second state parameter corresponding to the second data into the numerical calculation engine if the second data includes the uncorrectable error.

23. The memory storage device of claim 22, wherein the memory controlling circuit unit performs the first decoding operation to correct errors in the third data according to third encoded data, the memory controlling circuit unit outputs the third data if the third data does not include the errors, if the errors in the third data are corrected, the memory controlling circuit unit outputs the third data with the errors corrected, and the memory controlling circuit unit determines that a failure occurs if the first physical programming unit is read by using the first decoding operation if the third data includes the uncorrectable error.

24. The memory storage device of claim 21, wherein the third read voltage is an optimal read voltage for reading the first physical programming unit.

25. The memory storage device of claim 21, wherein the first state parameter comprises the first data, a total of bit values being 1 in the first data, a total of the bit values being 0 in the first data or a sum of first syndromes corresponding to the first data.

26. The memory storage device of claim 21, wherein the second state parameter comprises the second data, a total of bit values being 1 in the second data, a total of the bit values being 0 in the second data or a sum of second syndromes corresponding to the second data.

27. The memory storage device of claim 21, wherein the memory controlling circuit unit loads at least one calculation parameter obtained through a pre-training from the rewritable non-volatile memory module into the numerical calculation engine if the rewritable non-volatile memory module is powered up.

28. The memory storage device of claim 27, wherein the calculation parameter comprises a pre-defined weight or a bias, wherein in the operation of determining the third read voltage for reading the first physical programming unit among the read voltages by the numerical calculation engine according to the first state parameter and the second state parameter, the numerical calculation engine determines the third read voltage according to the first state parameter, the second state parameter and the pre-defined weight or the bias.

29. The memory storage device of claim 21, wherein the memory controlling circuit unit receives a first write command from the host system, the memory controlling circuit unit inputs a third state parameter corresponding to the first write command into the numerical calculation engine, and determines a type of first write data corresponding to the first write command by the numerical calculation engine according to the third state parameter.

30. The memory storage device of claim 29, wherein the third state parameter comprises a first logical address, a location parameter or a command type corresponding to the first write data, wherein in the operation of determining the type of the first write data corresponding to the first write command by the numerical calculation engine according to the third state parameter, the memory controlling circuit unit determines whether the first write data is hot data or clod data by the numerical calculation engine according to the third state parameter, wherein an access frequency of the hot data is higher than an access frequency of the cold data.

* * * * *